United States Patent [19]

Brooks

[11] Patent Number: 5,496,775
[45] Date of Patent: Mar. 5, 1996

[54] SEMICONDUCTOR DEVICE HAVING BALL-BONDED PADS

[75] Inventor: J. M. Brooks, Caldwell, Id.

[73] Assignee: Micron Semiconductor, Inc., Boise, Id.

[21] Appl. No.: 225,196

[22] Filed: Apr. 8, 1994

Related U.S. Application Data

[62] Division of Ser. No. 914,275, Jul. 15, 1992, abandoned.

[51] Int. Cl.$^6$ .................................................. H01L 21/60
[52] U.S. Cl. ........................... 437/219; 437/209; 437/211; 437/214; 437/215
[58] Field of Search ..................... 257/734, 737, 257/738, 774, 777, 787, 792; 437/219, 209, 211, 214, 217, 183, 189, 190, 191, 192

[56] References Cited

U.S. PATENT DOCUMENTS

| | | | |
|---|---|---|---|
| 3,212,160 | 10/1965 | Dale et al. | 257/738 |
| 4,600,600 | 7/1986 | Pammer et al. | 437/183 |
| 4,807,021 | 2/1989 | Okumura | 257/777 |
| 4,899,107 | 2/1990 | Corbett et al. | 324/158 |
| 5,071,787 | 12/1991 | Mori et al. | 437/183 |
| 5,143,865 | 9/1992 | Hideshima et al. | 437/183 |
| 5,289,346 | 2/1994 | Carey et al. | 437/209 |
| 5,341,564 | 8/1994 | Akhavain et al. | 437/183 |
| 5,348,607 | 9/1994 | Wojnarowski | 437/209 |

OTHER PUBLICATIONS

"Tape Automated bonding Standardization and Implementation Requirements (Proposal)", Jul. 1983, Solid State Products Engineering Council, 2001 Eye Street, NW, Washington D.C.

"Shindo TAB", a sales brohcure for TAB tape, Toray Marketing & Sales (America), Inc, 1875 S. Grant St Suite 720, San Mateo, CA date unknown.

*Primary Examiner*—Brian E. Hearn
*Assistant Examiner*—Kevin M. Picardat
*Attorney, Agent, or Firm*—Kevin D. Martin

[57] ABSTRACT

An integrated circuit (IC) device comprises towers of bonded gold balls located on each bond pad. The towers allow for early encapsulation of the IC die. The IC can then be tested and attached to tab tape or a printed circuit board without particulate contamination concerns.

21 Claims, 3 Drawing Sheets

5,496,775

SEMICONDUCTOR DEVICE HAVING BALL-BONDED PADS

CROSS REFERENCE TO RELATED APPLICATION

This is a division of application Ser. No. 07/914,275, filed Jul. 15, 1992, now abandoned.

FIELD OF THE INVENTION

This invention relates to the field of integrated circuits and more particularly to a process for fabricating an IC which does not require a lead frame.

BACKGROUND OF THE INVENTION

Historically, integrated circuits (ICs) have comprised a semiconductor die supported by a conductive lead frame. As illustrated in FIG. 1, the typical IC 10 has lead frame leads 12 and a paddle 14, a die 16 having a front side with circuitry and a back side, bond wires 18, and encapsulation material or layer 20. Bond wires 18 attach to bond pads (not shown) on the front of the die 16. Bond wires provide the connection between the IC die and the lead frame leads which are attached to printed circuit boards (PCBs) or other devices (not shown).

The semiconductor industry pursues cost effective and reliable methods to decrease the size of semiconductor packages. The development of the dual in-line package (DIP) has been instrumental in the development of thin small outline packages (TSOPs), tape automated bonding (TAB), and chip on board (COB) technologies.

COB assembly processes typically include the steps of bonding a die to a substrate and interconnecting the die to the substrate, using either conventional wirebond or TAB methods.

In reference to FIG. 1, TAB technology has eliminated the lead frame leads 12 and paddle 14 and uses a "tab tape." Tab tapes comprise a pre-designed network of electrical lines and buses which are attached to an IC die. The use of tab tape and the elimination of lead frames save on fabrication steps and costs. Typically, the die is connected to the tab tape by a thermocompression or thermosonic bonder.

The prior processes have various disadvantages. Specifically, the testing of IC chips occurs after the tab tape is attached to a number of die and to the substrate. Thus, when reliability testing takes place, any defective die would require replacement, which would increase costs. Additionally, by using these processes, several steps occur while the die is unprotected or not encapsulated resulting in additional die defects from increased exposure to the environment.

It is noted that the above-described problems, as well as other problems, are solved through the subject invention and will become more apparent to one skilled in the art from the detailed description herein.

SUMMARY OF THE INVENTION

One skilled in the art will appreciate the advantage of the subject IC and fabrication process for attaching an encapsulated and tested IC die to a PC board. Specifically, a semiconductor packaging technique is disclosed which is cost effective, reliable, and allows for testing of an IC die before it is mounted to tab tape or soldered to a PC board. Uniquely, several layers of bonded beads are formed and stacked higher than a total IC covering.

Features of the present invention will become apparent from the following detailed description of the illustrated embodiment taken in conjunction with the accompanying drawings.

It is noted that the illustrated embodiments are not drawn to scale, and they are only generally representative of the features of the invention.

DETAILED DESCRIPTION OF THE ILLUSTRATED EMBODIMENTS

The following U.S. patent is herein incorporated by reference: U.S. Pat. No. 4,899,107 is a discrete die burn-in for unpackaged die having same assignee as the present invention.

For the purpose of providing background material which may in some respects illustrate the state of the art, the following materials are herein incorporated by reference: Tape Automated Bonding Standardization and Implementation Requirements (Proposal), Jul., 1983, from the Solid State Products Engineering Council, 2001 Eye Street, NW, Washington D.C. 20006. Shindo TAB, a sales brochure for TAB tape, Toray Marketing & Sales (America), Inc., 1875 South Grant St., Suite 720, San Mateo, Calif. 94402.

Figure 1:
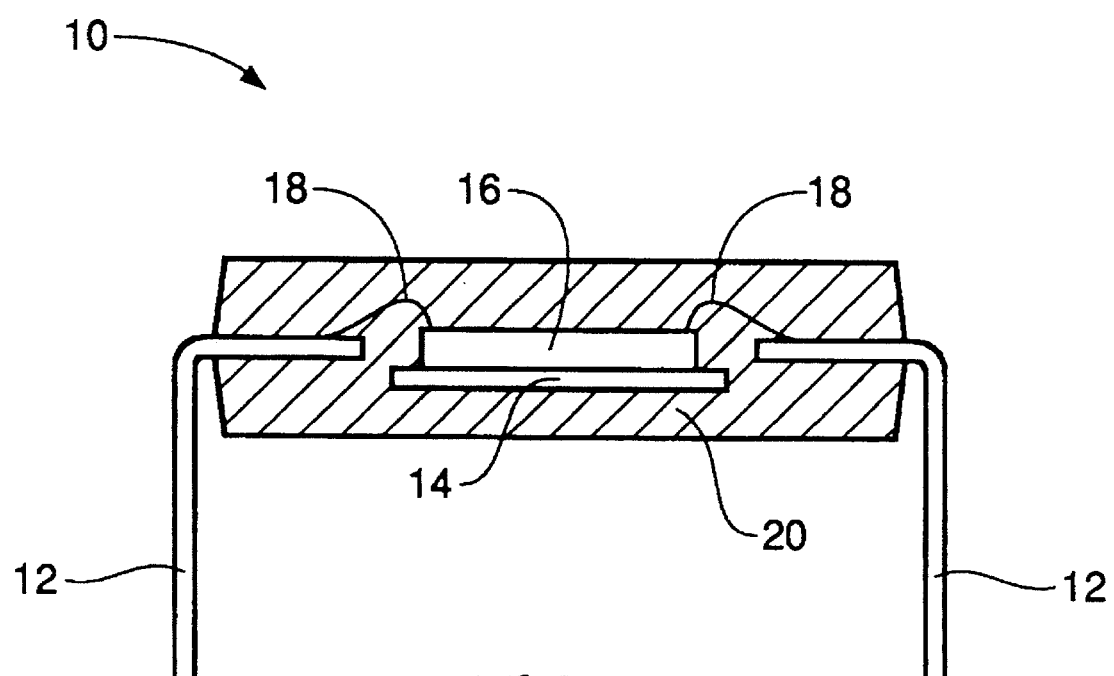
FIG. 1 is a detailed illustration of related art.
Figure 2:
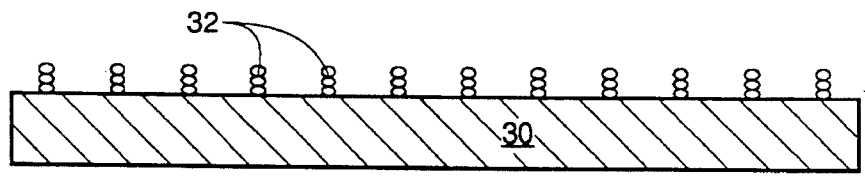
FIGS. 2 through 5 illustrate process steps used with the inventive process.

FIG. 2 is a detailed illustration of a first fabrication process of the invention, and includes the following elements: IC die 30, and gold ball towers 32.

In this first process there are two steps. First, a completed IC die is manufactured and second, gold balls are welded in a tower fashion onto each bond pad of the die.

One skilled in the art will recognize that there are many methods of creating a tower of gold material welding beads or balls. Moreover, 5 mil (1 mil=0.001 inches) wire is widely available which, after welding, will result in a ball having a diameter of about 15 mil. During the welding process the ball will decrease in height to about ½ to ⅔ of the diameter. It is noted that any size of gold bond wire may be used to comply with design constraints, and thus other sized balls may be similarly manufactured. Towers may be placed on any side of the die or on several sides of the die. Additionally, the gold material suggested may vary to other applicable materials or percentage of materials known for IC welding purposes. Finally, the height of the tower will vary depending upon the size of each ball and the number of balls used in the tower, for example up to 20 mils or higher. In this embodiment, it is desirable that the tower be higher than the encapsulating material.

Figure 3:
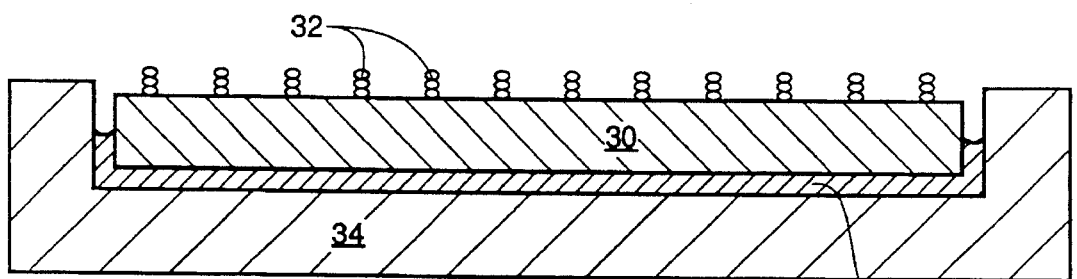

The second main fabrication process is illustrated in FIG. 3. As shown in FIG. 3, the gold ball tower bonded die is placed into a cavity of a cavity bar holder 34 and onto a first layer of encapsulation material 36A.

One skilled in the art will recognize that the gold towers are exposed and facing upwards. Moreover, the encapsulating material acts as a cushion between the die and holder 34, thus preventing damage. The encapsulating material may have any desired thickness on all the faces of the die except for the side having the towers. The thickness of the encapsulating material on the tower side of the die must be less than the height of the towers thereby allowing for subsequent welding steps. Additionally, most any commonly known encapsulant material will suffice, such as siloxane polyimide etc.

Figure 4:
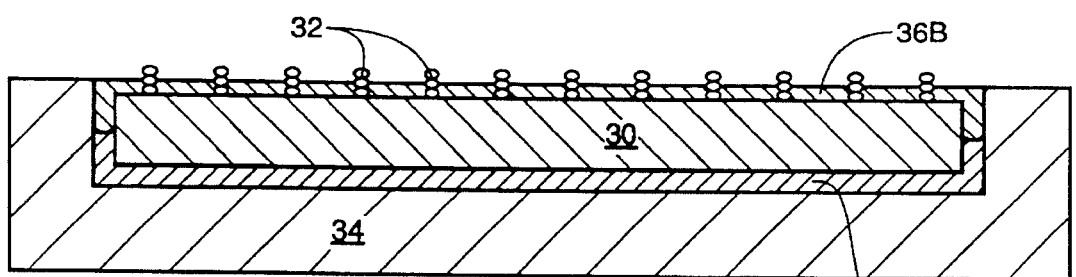
Figure 5:
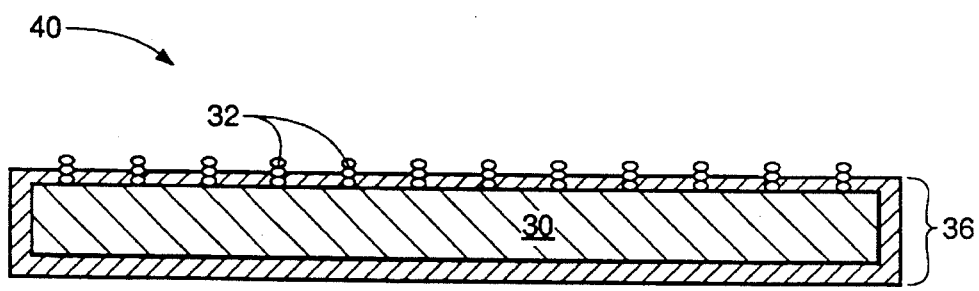

A third main fabrication process is illustrated in FIG. 4. In this step a second layer of encapsulation material 36B is applied over the tower side of the die. Thereby, the die surface is completely covered while the towers are partially submerged in the material. However, it is noted that a portion of the towers are not submerged in the material. The encapsulant fills a volume not occupied by encapsulation material 36A resulting in an encapsulated IC die as illustrated in FIG. 5 after the encapsulated device 40 is removed from the cavity bar holder 34.

Figure 6:
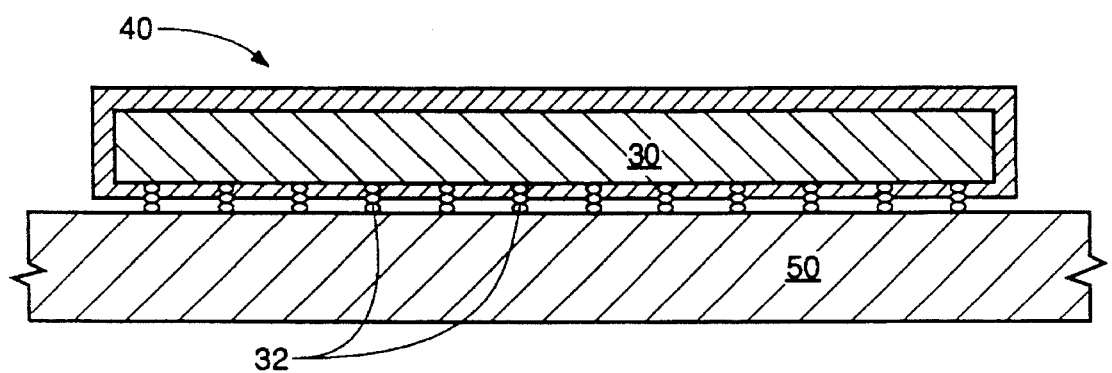
FIG. 6 illustrates the bonding of ball bonded IC die to an electrical substrate providing electrical connection to other devices.

One skilled in the IC fabrication art will recognize that towers 32 function as leads. Therefore, the IC 40 can be tested for reliability and other factors before being mounted to tab tape or a PC board 50 as illustrated in FIG. 6. Additionally, any subsequent steps need not be concerned with contaminating the IC die since the encapsulating process is completed.

One skilled in the art will recognize that there are many variations to the illustrated embodiment. The ball bonded material may be any suitable welding material, such as compositions comprising aluminum, palladium, or other suitable materials.

The encapsulation sheath can comprise many types of known materials suitable for that purpose, such as siloxane polyimide and epoxy novolac based materials.

There are several methods of attaching the completed ball bonded die onto a substrate. It is possible to weld the ball tower to the substrate. The ball bonded die can also be clipped into a type of receptacle or socket, thus enabling easier removal for faster replacement of parts.

While the invention has been taught with specific reference to one embodiment, one skilled in the art will recognize that changes can be made in form and detail without departing from the spirit and the scope of the invention.

I claim:

1. A process for forming a semiconductor device, comprising the following steps:
   a) forming a semiconductor die having a back and a front, said front having pads thereon;
   b) forming a tower of conductive balls on at least one of said pads;
   c) providing a cavity bar holder having a cavity therein;
   d) forming a first layer of encapsulation material within said cavity, thereby partially filling said cavity with said first layer of encapsulation material;
   e) placing said back of said semiconductor die in contact with said first layer of encapsulation material;
   f) forming a second layer of encapsulation material within said cavity to cover said semiconductor die, thereby encapsulating said die with said first and second layers of encapsulation material and leaving a portion of each said tower exposed; and
   g) removing the encapsulated die from said cavity.

2. The process of claim 1, wherein said conductive balls are formed by welding.

3. The process of claim 1 wherein each of said balls has a height and a diameter and said height is between about ½ and ⅔ of said diameter.

4. The process of claim 1 wherein said balls comprise a material selected from the group consisting of gold, aluminum, and palladium.

5. The process of claim 1 wherein said tower is about 20 mils or less in height.

6. The process of claim 1 wherein at least one of said balls is completely encased by said second layer of encapsulation material.

7. A process for forming a semiconductor device having no lead frame and no paddle, comprising the following steps:
   a) forming a semiconductor die having a back and a front, said front having pads thereon;
   b) forming a tower of conductive balls on at least one of said pads;
   c) providing a cavity bar holder having a cavity therein;
   d) forming a first layer of encapsulation material within said cavity;
   e) placing said back of said semiconductor die in contact with said first layer of encapsulation material;
   f) forming a second layer of encapsulation material within said cavity to cover said semiconductor die, said first layer of encapsulation material supporting said die during encapsulation of said die with said second encapsulation layer, thereby sealing said die with said first and second layers of encapsulation material and leaving a portion of each said tower exposed; and
   g) removing the encapsulated die from said cavity.

8. The process of claim 7, wherein said conductive balls are formed by welding.

9. The process of claim 7 wherein each of said balls has a height and a diameter and said height is between about ½ and ⅔ of said diameter.

10. The process of claim 7 wherein said balls comprise a material selected from the group consisting of gold, aluminum, and palladium.

11. The process of claim 7 wherein said tower is about 20 mils or less in height.

12. The process of claim 7 wherein at least one of said balls is completely encased by said second layer of encapsulation material.

13. A process for forming a semiconductor device having no lead frame and no paddle, comprising the following steps:
   a) forming a semiconductor die having a back and a front, said front having pads thereon;
   b) forming a first conductive ball on at least one of said pads;
   c) welding a second conductive ball to each of said first conductive balls, and welding a third conductive ball to each of said second conductive balls, said first, second, and third conductive balls on each of said pads forming a tower;
   d) providing a cavity bar holder having a cavity therein;
   e) forming a first layer of encapsulation material within said cavity, thereby partially filling said cavity with said first layer of encapsulation material;
   f) placing said back of said semiconductor die in contact with said first layer of encapsulation material;
   g) forming a second layer of encapsulation material within said cavity to cover said semiconductor die, said first layer of encapsulation material supporting said die during encapsulation of said die with said second encapsulation layer, thereby sealing said die with said first and second layers of encapsulation material and leaving a portion of each said tower exposed; and
   h) removing said encapsulated die from said cavity.

14. The process of claim 13 wherein each of said balls has a height and a diameter and said height is between about ½ and ⅔ of said diameter.

15. The process of claim 13 wherein said balls comprise a material selected from the group consisting of gold, aluminum, and palladium.

16. The process of claim 13 wherein said tower is about 20 mils or less in height.

17. The process of claim 13 wherein each of said first balls is completely encased by said second layer of encapsulation material.

18. A process for forming a semiconductor device, comprising the following steps:

a) providing a cavity bar holder having a cavity therein;

b) forming a first layer of encapsulation material within said cavity;

c) placing a semiconductor die in contact with said first layer of encapsulation material;

d) forming a second layer of encapsulation material within said cavity to encapsulate said die; and e) removing said encapsulated die from said cavity.

19. The process of claim 18 wherein said die comprises pads, further comprising the step of forming a conductive ball on said pad.

20. The method of claim 18 further comprising forming a first conductive ball on said pad and a second conductive ball on said first conductive ball.

21. The process of claim 20 wherein said first ball is encased by said encapsulation material.

* * * * *